(12) United States Patent
Shirakawa (10) Patent No.: US 6,753,508 B2
(45) Date of Patent: Jun. 22, 2004

(54) HEATING APPARATUS AND HEATING METHOD

(75) Inventor: Eiichi Shirakawa, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/151,968

(22) Filed: May 22, 2002

(65) Prior Publication Data

US 2002/0177094 A1 Nov. 28, 2002

(30) Foreign Application Priority Data

May 25, 2001 (JP) ........................................ 2001-157030

(51) Int. Cl.$^7$ ................................................ H05B 3/68
(52) U.S. Cl. ................. 219/444.1; 219/448.1; 219/443.1; 219/468.1; 219/504; 219/390; 392/416; 392/418
(58) Field of Search ........................... 219/444.1, 448.1, 219/443.1, 465.1, 466.1, 468.1, 504, 385, 390, 405, 411; 392/416, 418

(56) References Cited

U.S. PATENT DOCUMENTS

| 5,941,083 | A | | 8/1999 | Sada et al. |
| 6,222,161 | B1 | | 4/2001 | Shirakawa et al. |
| 6,344,632 | B1 | * | 2/2002 | Yu et al. .................. 219/444.1 |
| 6,402,509 | B1 | * | 6/2002 | Ookura et al. .............. 432/253 |

* cited by examiner

*Primary Examiner*—Shawntina Fuqua
(74) *Attorney, Agent, or Firm*—Oblon, Spivak, McClelland, Maier & Neustadt, P.C.

(57) ABSTRACT

A heating apparatus includes a central hot plate for heating the center portion of a substrate, a plurality of segment hot plates for heating the peripheral portion of the substrate, a hot plate support member supporting the central hot plate and the segment hot plates, support pins for supporting the substrate so as to face the central hot plate and the segment hot plates in a close proximity without being in contact with the central hot plate and the segment hot plates, and a power supply for supplying electricity to the central hot plate and the segment hot plates.

18 Claims, 9 Drawing Sheets

HEATING APPARATUS AND HEATING METHOD

CROSS-REFERENCE TO RELATED APPLICATIONS

This application is based upon and claims the benefit of priority from the prior Japanese Patent Application No. 2001-157030, filed May 25, 2001, the entire contents of which are incorporated herein by reference.

BACKGROUND OF THE INVENTION

1. Field of the Invention

The present invention relates to an apparatus and method for heating a substrate.

2. Description of the Related Art

In a photolithographic step for a semiconductor device, various types of heating processes are performed including prebaking for vaporizing a solvent from a resist solution applied to a semiconductor wafer and post-exposure baking (PEB) for improving the sensitivity of a chemically amplified resist film after light exposure.

Such a heating process is performed by mounting a wafer on a hot plate of a heating apparatus, so that thermal energy is directly transferred from the hot plate to the wafer while the hot air in the process chamber is removed by an exhaust cover. As a conventional hot plate, a thick ceramic plate of disk-like form is used (which is manufactured by sintering powders such as silicon carbide or aluminum nitride to form a single piece). A resistance heater is embedded in the hot plate for heating the wafer to a predetermined target temperature. In the baking process of general photolithography, a wafer is heated to within the range of about 100 to 200° C.

Figure 15:
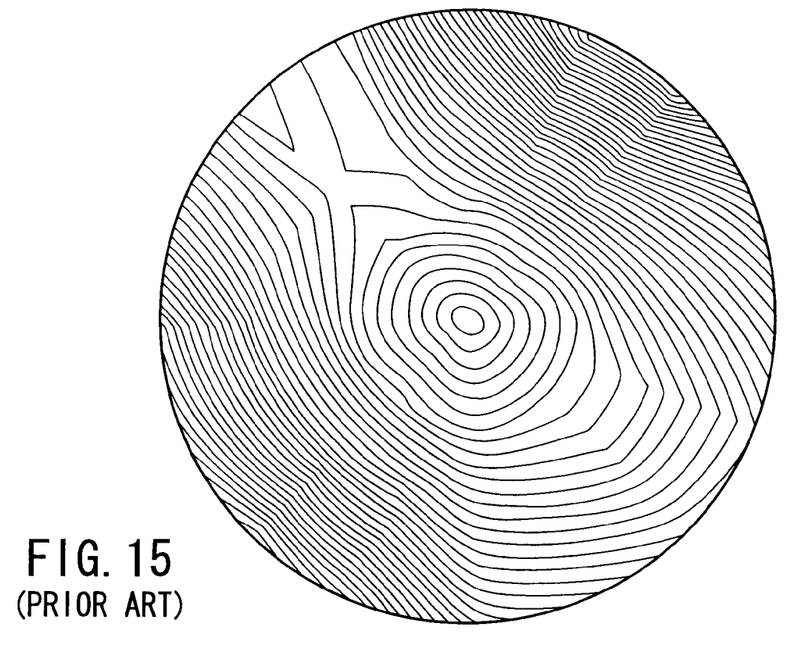
FIG. 15 is a schematic plan view showing the state of the heat distortion of a conventional hot plate.

However, recently, a baking process for heating a wafer to a further higher temperature range has come into use with diversification of manufacturing processes for semiconductor devices. In such a baking process, a wafer is heated to, for example, about 700° C. However, if a conventional hot plate is baked in such a high-temperature baking process, the hot plate becomes warped. More specifically, both ends of the plate become warped as shown in FIG. 15. When a conventional hot plate was experimentally heated to 700° C., it was confirmed that the hot plate cannot withstand the warping and sometimes breaks. In addition, when a wafer is loaded into or unloaded from a heating process chamber, ambient air flows into the heating process chamber to change the inner temperature thereof by about 100° C. Since heating and cooling are repeated, the hot plate repeatedly expands and contracts, so that the quality of the hot plate deteriorates in a short time.

Figure 16:
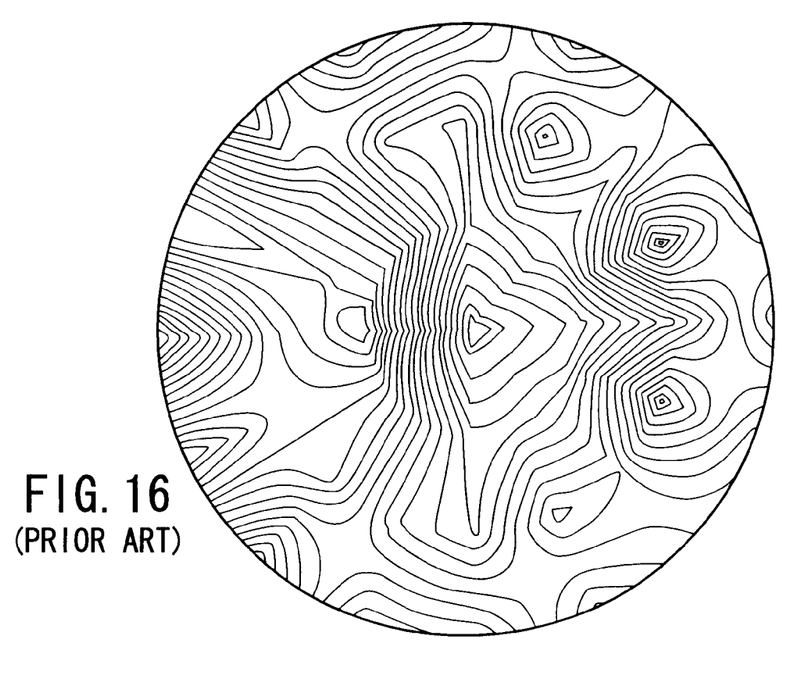
FIG. 16 is a schematic plan view showing the state of the heat distortion of a semiconductor wafer heated by the conventional hot plate.

When the hot plate distorts, the heat is transferred non-uniformly from the hot plate to the wafer, with the result that the wafer is non-uniformly heated. The wafer becomes wavy and distorted like a saddle-back, as shown in FIG. 16. Such a distortion is undesirable since it decreases dimensional accuracy and the yield of a semiconductor device. In particular, these days, the size of wafers has been increased in order to improve productivity, etc. In view of this tendency, the distortion of wafers becomes a serious problem. It is therefore desired to decrease the distortion of wafers.

The hot plate to be used in the heating process is desirably thin in view of heat response (quickly heating and cooling). Nevertheless, the thickness of the hot plate has not actually been reduced because a minimum strength is required to prevent breakage of the hot plate as mentioned above. Particularly, in the case where the heating process is performed at a higher temperature, it is difficult to reduce the thickness of the hot plate.

BRIEF SUMMARY OF THE INVENTION

An object of the present invention is to provide a heating apparatus and method using a thinner hot plate for heating a substrate while preventing a crack of the hot plate by suppressing the distortion of the hot plate.

According to the present invention, there is provided a heating apparatus for heating a substrate to be processed by photolithography, comprising

- a central hot plate having a heat-generating surface which faces a center portion of a lower surface of the substrate and heating the center portion of the substrate;
- a plurality of segment hot plates provided so as to surround a periphery of the central hot plate in a plan view, having a heat generating surface facing a peripheral portion of the lower surface of the substrate and heating a periphery of the substrate;
- a hot plate support member supporting the central hot plate and the segment hot plates;
- a substrate support member supporting the substrate so as to face the central hot plate and the segment hot plates in a close proximity without being in contact with the central hot plate and the segment hot plates; and
- a power supply for supplying electricity to the central hot plate and each of the segment hot plates.

According to the present invention, there is provided a method of heating a substrate to be processed by photolithography, comprising:

(a) preparing a central hot plate having a heat-generating surface which faces a center portion of a lower surface of the substrate and a plurality of segment hot plates each having a heat-generating surface which faces a peripheral portion of the lower surface of the substrate;

(b) arranging the plurality of segment hot plates around the central hot plate; forming an annular clearance between the segment hot plates and the central hot plate, inserting a plurality of support pins into the annular clearance from the bottom and allowing the support pins to protrude upward, supporting the substrate by the support pins without being in contact with the segment hot plates and the central hot plate; and (c) heating the center portion of the lower surface by the central hot plate, heating the peripheral portion of the substrate by the plurality of segment hot plates, thereby heating the entire substrate to a predetermined target temperature.

By combining a plurality of segment hot plates with the central hot plate as mentioned above, each of the hot plates is reduced in size. As a result, the distortion of the entire hot plate assembly is greatly reduced to maintain it flat. Since the distortion of the hot plate itself is suppressed, the thickness of the hot plate can be reduced. When the hot plate thus reduced in thickness is used, high heat response (quickly heating and cooling) of the hot plate is improved. It is therefore possible to quickly increase or decrease the temperature of the hot plate.

Furthermore, since the structures of the segment hot plates and the central hot plate are simplified, the manufacturing process of the hot plate becomes simple, reducing manufacturing cost. Furthermore, the performances of the segment hot plates and the central hot plate can be independently evaluated. In the case, if a defective plate is included in the hot plate assembly, it is sufficient to discard only the defective plate. The yield is therefore improved. In the event where the hot plate assembly becomes out of order during use, it is not necessary to discard the entire hot plate assembly but necessary to replace only a broken part with a new one. For this reason, the maintenance cost is greatly reduced.

The central hot plate preferably has a circular from in a plan view. The segment hot plates are formed by dividing a ring-form peripheral portion surrounding the central hot plate into four regions and preferably has a fan-shape in a plan view. Note that it is most preferable that the form of the central hot plate should be a perfect circle in a plan view. However, the central hot plate may be a polygon such as a right hexagon, right octagon, right decagon, and right dodecagon. The shape of the segment hot plate in a plan view is most preferably a fan-shape, however, a trapezoid may be acceptable.

Furthermore, it is preferable to have a temperature control unit for controlling the amount of heat generated from each of the segment hot plates by controlling the amount of electricity to be supplied from a power supply to each of the segment hot plates. By controlling the heating operation of each segment hot plate in this manner, it is possible to minutely control the temperature of the substrate peripheral portion to significantly reduce the heat distortion amount of the substrate peripheral portion.

It is further preferable to have a thermo sensor provided to each of the segment hot plate and the substrate in noncontact therewith, for detecting at least one of temperatures of the lower and upper surfaces with respect to (the hot plate and) the substrate. By using the non-contact thermo sensor, the thickness of the hot plate can be reduced. In the event where a part of the hot plate becomes out of order, the same thermo sensor may be used continuously without being replaced.

The thermo sensor is preferably arranged immediately below the radial clearance formed between adjacent segment hot plates. This is because the temperature of the lower surface of the substrate, which receives radiant heat energy from the heat-generating surface of the hot plate can be directly detected by the thermo sensor. Note that the thermo sensor may be arranged above the hot plate assembly. This is because the upper surface temperature of the substrate can be detected by the thermo sensor thus arranged. Alternatively, by using the lower temperature sensor and the upper temperature sensor in combination, both the temperature of the upper and lower surfaces of the substrate may be detected.

Furthermore, it is preferable to have an up-and-down movement mechanism for moving up and down the segment hot plates together with the hot plate support member. By controlling the distance between the substrate and the segment hot plates by the up-and-down moving mechanism, it is possible to minutely control the heat amount given to the substrate from the segment hot plates. As a result, the substrate is more uniformly heated and the heat distortion of the substrate is further efficiently suppressed.

It is desirable that the substrate support member be independently and discretely formed from the hot plate support member such that the load of the substrate should not be applied to the hot plate assembly. By virtue of this structure, the distortion of the hot plate due to the load of the substrate can be suppressed. In addition, since the load to be applied to the hot plate is reduced, the thickness of the hot plate can be reduced.

An annular clearance is formed between the central hot plate and the segment hot plates. The substrate support member is formed of a plurality of support pins arranged within the annular clearance. It is further preferable to have a rotation-driving mechanism for rotating a plurality of support pins. Since the substrate can be rotated by this construct during the baking process, even if temperatures slightly differ between the segment hot plates, the difference of heat amounts received by the substrate can be cancelled out. As a result, the substrate can be heated uniformly. Furthermore, the alignment operation of the substrate usually performed by a conventional method can be omitted.

It is also preferable that a shielding member should be provided below the hot plate assembly for inhibiting cool air from passing through the annular clearance. Such a shielding member is desirably attached to the support pins and a ring-form seal film made of a polyimide resin. It is also desirable that numerous small holes are formed in the ring-form seal film to prevent a local temperature change of the substrate above the hot plate by air flowing through the annular clearance.

The central hot plate has an outer peripheral edge surface formed obliquely at a predetermined angle with respect to the heat-generating surface. The annular clearance obliquely formed between the outer peripheral edge surfaces of the central hot plate and the segment hot plates, that is, the inner peripheral edge surface of each of the segment hot plates, which is obliquely formed at a predetermined angle with respect to the heat-generating surface. It is preferable that the outer peripheral edge surface of the central hot plate should be overlapped with the inner peripheral edge surfaces of the segment hot plates in a plan view. Heat energy is emitted from both the outer peripheral edge surface and the inner peripheral edge surfaces in the same manner as from the heat-generating surface. However, the lower surface of the substrate cannot be seen through the annular clearance obliquely formed, so that the substrate can be efficiently prevented from being heated nonuniformly.

Furthermore, the segment hot plates may preferably comprise a plurality of inner segment hot plates concentrically arranged around the central hot plate and a plurality of outer segment hot plates concentrically arranged around the inner segment hot plates. By increasing the number of the segment hot plate in this manner, it is possible to minutely control the temperature of the substrate peripheral portion.

Furthermore, a first radial clearance is formed between adjacent inner peripheral segment hot plates and a second radial clearance is formed between adjacent outer peripheral segment hot plates. The second radial clearance is preferably formed away from the first clearance so as not to position on the extension line of the first radial clearance. In this case, it is preferable that a thermo sensor should be arranged immediately below at least one of the first and second radial clearances without being in contact with the segment hot plates, for detecting the temperature of the lower surface of the substrate. It is therefore possible to directly detect the temperature of the lower surface of the substrate, which receives radiant heat energy from the heat-generating surface of the hot plate and control the heating temperature more accurately.

The diameter of the central hot plate preferably falls within the range of 20 to 60% of the diameter of the entire hot plate assembly and more preferably 40–50%.

DETAILED DESCRIPTION OF THE INVENTION

Now, preferable embodiments of the present invention will be explained with reference to the accompanying drawings.

Figure 1:
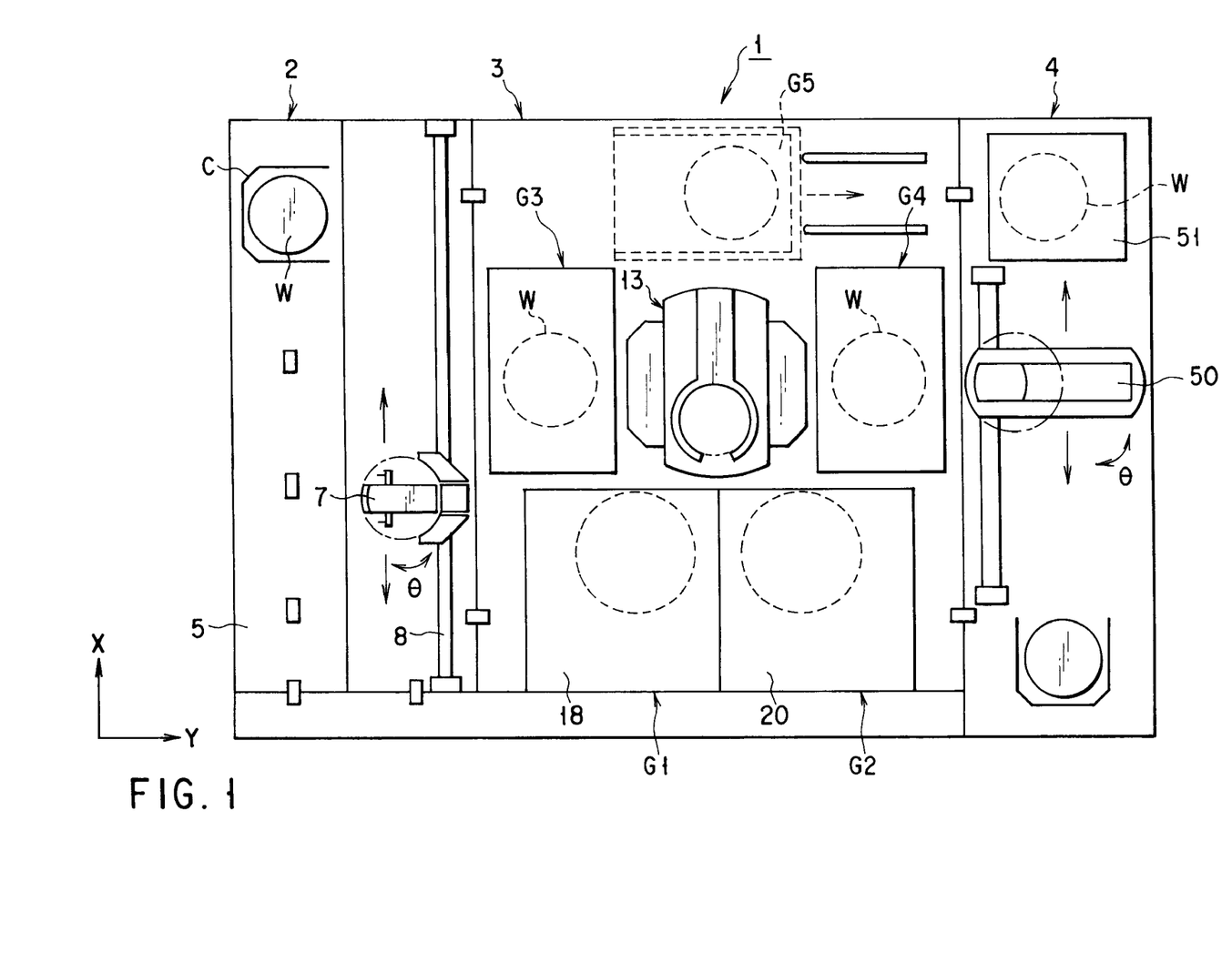
FIG. 1 is a schematic plan view of a coating and developing system.

As shown in FIG. 1, a coating and developing system 1 comprises a cassette station 2, a process station 3, and an interface section 4, which are integrated into one body. The cassette station 2 is used not only for loading and unloading a cassette C (storing 25 wafers) into and from the coating and developing system 1, but also for loading and unloading a wafer W into and from the cassette C. The process station 3 comprises various process units arranged in multiple stages for sequentially processing wafers one by one in the coating and developing process. The interface section 4 is used for transferring a wafer W to and from a light exposure apparatus arranged adjacent to the process station 3.

In the cassette station 2, a cassette table 5 is provided so as to extend along the X-axis. A plurality of cassettes C is juxtaposed on the cassette table 5. A transfer passage 8 is formed almost in parallel to the cassette table 5. A sub arm mechanism 7 movable along the X-axis is arranged along the transfer passage 8.

The sub arm mechanism 7 has an alignment mechanism for aligning a wafer W. The sub arm mechanism 7 can get access to an extension unit 32 belonging to a third process unit group G3 described later.

In the process station 3, a main arm mechanism 13 is provided at the center. The main arm mechanism 13 is surrounded by process unit groups, each consisting of various process units arranged in multiple stages. In the coating and developing system 1, four process unit groups G1, G2, G3, and G4 are arranged. To explain more specifically, the first and second process unit groups G1 and G2 are arranged at the front side of the coating and developing system 1. The third process unit group G3 is arranged adjacent to the cassette station 2 whereas the fourth process unit group G4 is arranged adjacent to the interface section 4. Furthermore, a fifth process unit group G5 (shown in a broken line) may be arranged at the backside at option. The main arm mechanism 13A loads and unloads a wafer W into and from each of the process units of these process unit groups G1, G2, G3, G4 and G5. Note that the number and arrangement of process unit groups vary depending upon a type of processing to be applied to a wafer W. Any number of process unit groups may be used as long as the number is larger than one.

Figure 2:
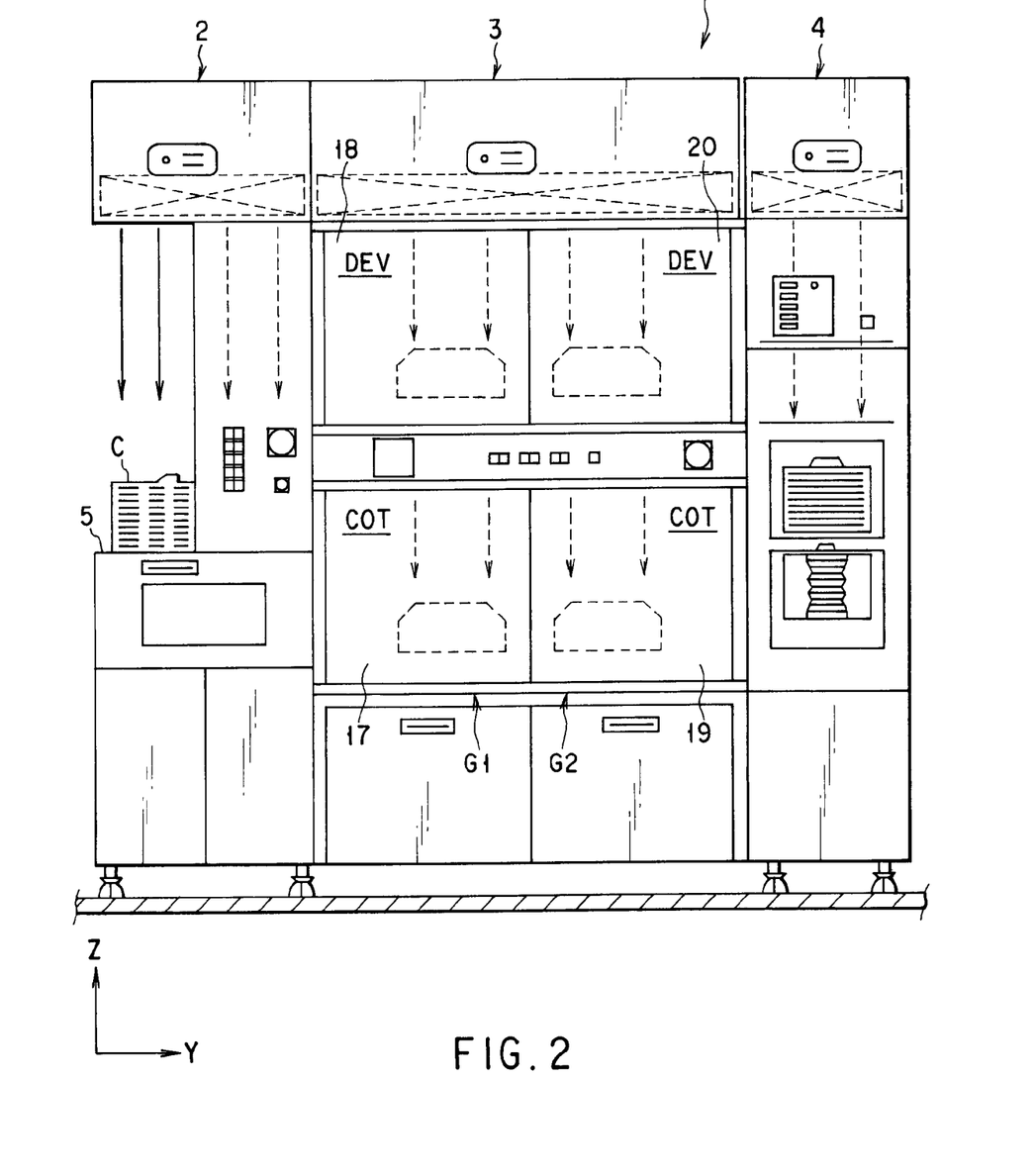
FIG. 2 is a schematic front view of the coating and developing system.

The first process unit group G1, as shown in FIG. 2, comprises a resist coating unit 17 for applying a resist solution to a wafer W to form a resist film on the wafer W and a developing unit 18 for developing the wafer W after light exposure, both being arranged in two stages in this order from the bottom. The second process unit group G2 comprises a resist coating unit 19 and a developing unit 20 arranged in two stages in this order from the bottom.

Figure 3:
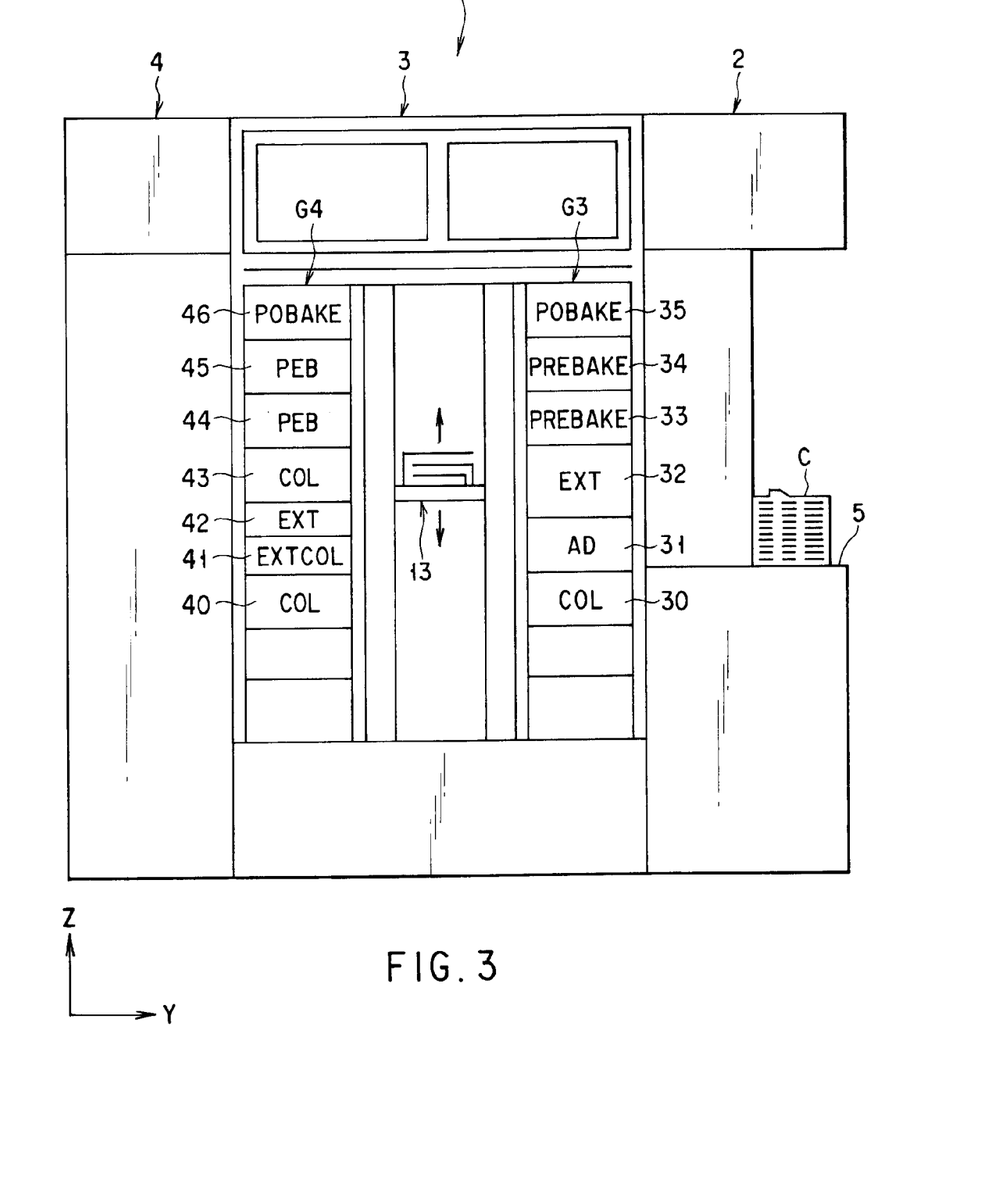
FIG. 3 is a schematic back view of the coating and developing system.

The third process unit group G3, as shown in FIG. 3, comprises a cooling unit 30 for cooling a wafer W, an adhesion unit 31 for improving adhesion between a resist solution and the wafer W, an extension unit 32 for transferring the wafer W, prebaking units 33 and 34 for vaporizing a solvent contained in the resist solution, and a postbaking unit 35 for baking the wafer W after development. They are stacked in this order from the bottom, for example, in 6 stages.

The fourth process unit group G4 comprises a cooling unit 40, an extension-cooling unit 41 for cooling the wafer W mounted thereon under natural conditions, an extension unit 42, a cooling unit 43, a post-exposure baking units 44 and 45 (hereinafter referred to as "PEB unit") serving as a heating process unit according to this embodiment, and a post baking unit 46. They are stacked in this order from the bottom, for example, in 7 stages.

At the center of the interface section 4, a second sub-arm mechanism 50 is provided as shown in FIG. 1. The second sub-arm mechanism 50 is configured so as to flexibly move in the X-axis (in the up and down direction in FIG. 1), the Z-axis (in the vertical direction to the paper surface) and rotate in the direction θ (having an angle θ with respect to the Z axis) so as to get access to the extension cooling unit 41, extension unit 42, peripheral light exposure unit 51, and a light exposure unit (not shown) and to transfer a wafer W to them.

Now, the PEB unit 44 will be more specifically explained.

Figure 4:
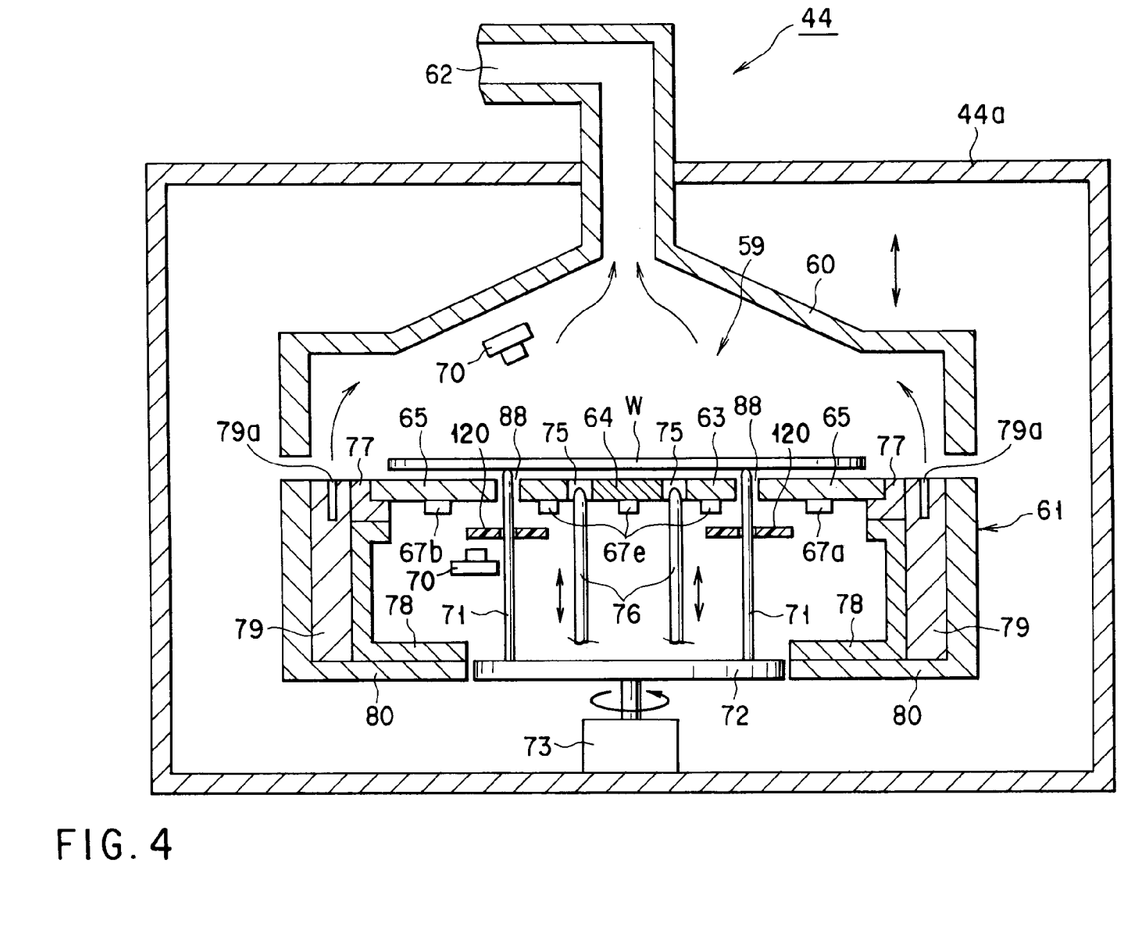
FIG. 4 is a perspective sectional view of a PEB apparatus according to an embodiment.

As shown in FIG. 4, a cover 60 and a hot plate housing section 61 are placed within a casing 44a of the PEB unit 44. The cover 60 can be liftabley arranged by an up-and-down moving unit (not shown). The hot plate housing section 61 has an opening portion at the top. The opening portion is closed by the cover 60 to form a process chamber 59.

The cover 60 has a virtually conical shape (height is gradually increased toward the center). At the top of the cover, an exhaust port 62 is formed, which communicates with a suction pump (not shown). The atmosphere of the process chamber 59 is removed through the exhaust portion 62.

On the other hand, the hot plate housing portion 61 has a hot plate assembly 63 for heating a wafer W mounted thereon. The hot plate assembly 63 is formed in a substantially circular disc having a thickness sufficiently and uniformly thick. More specifically, the hot plate assembly 63 is formed of a central hot plate 64 of circular form and four segment hot plates 65a, 65b, 65c, 65d, as shown in the plan view of FIG. 5. The hot plate assembly 63 has a thickness of about 0.2 mm to 1 mm and is formed of a ceramic having good heat conductivity, such as silicon carbide and aluminum nitride.

Figure 5:
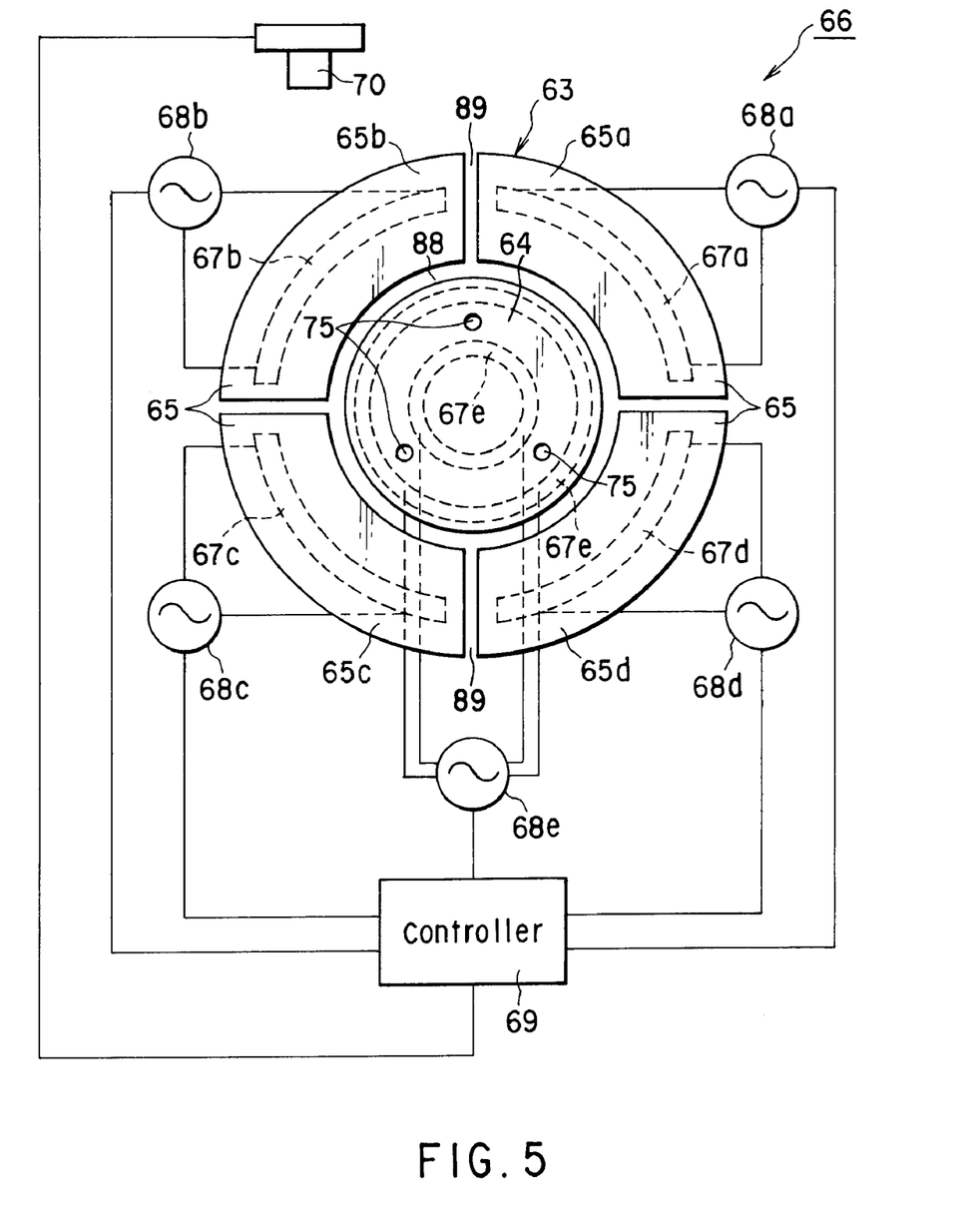
FIG. 5 is a plan block diagram of a hot plate assembly and a power supply circuit.

The hot plate assembly 63 has a thermo controller 66 for controlling the temperature thereof. The thermo controller 66 comprises heaters 67a, 67b, 67c, 67d, 67e as heat sources, and power supplies 68a, 68b, 68c, 68d, 68e for supplying power to the heaters 67a to 67e, respectively, a control section 69 for controlling the voltages of the power supplies 68a–68e, and two thermo-sensors 70 for detecting the temperatures of the central hot plate 64 of the hot-plate assembly 63, a wafer W, and/or segment hot plates 65.

The heaters 67a, 67b, 67c, and 67d are arranged and print-circuited at the lower surfaces of the segment hot plates 65a, 65b, 65c, and 65d, respectively in the form of arch, whereas the heater 67e is arranged and print-circuited at the lower surface of the central hot plate 64 in the form of double concentric circles.

One of the thermo-sensors 70 is arranged above the hot plate assembly 63 for detecting the surface temperature of a wafer W and/or the temperature of the segment hot plates 65. The other thermo-sensor 70 (referred to as a "lower thermo-sensor") is arranged below the hot plate assembly 63 for detecting the lower surface temperature of the wafer W and/or the temperature of the segment hot plates 65. More specifically, the lower thermo-sensor 70 is arranged immediately below a radial clearance 89 or an annular clearance 88. When the lower thermo-sensor 70 is arranged immediately below the radial clearance, it is preferable to arrange it so as not to interfere with a support pin(s) 71 and a shielding member 120.

The thermo-sensor 70 is a non-contact sensor, and is "Thermo-graphy" (trade mark) sensor, which measures a surface temperature of a substrate by irradiating it with infrared rays from some distance apart from the substrate. In the Thermo-graphy, since a standard heat radiation plate with a known radiant heat is used, the measurement is performed stably with high accuracy.

Not only the whole temperature of the hot plate assembly 63 but also each of the central hot plate 64 and segment hot plates 65a to 65d of the hot plate assembly 63 can be measured by the thermo-sensor 70. The detected data is output to the control section 69. The control section 69 can control the calorific value of each of the heaters 67a to 67e by way of power supplies 68a–68e so as to set the temperature of the central hot plate 64 and the segment hot plates 65a–65d at predetermined values. Therefore, the temperature of the hot plate assembly 63 is strictly controlled by the thermo controller 66.

Figure 11:
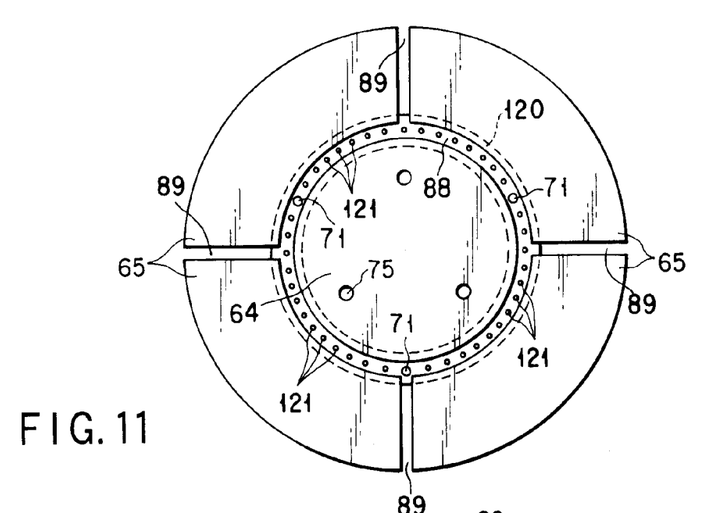
FIG. 11 is a plan view showing a hot plate assembly and a seal film.

As shown in FIG. 4, a continuous circular seal film 120 is attached to the support pin 71. More specifically, the seal film 120 is arranged so as to interfere with the annular clearance 88 in the plan view. As shown in FIG. 11, numerous holes 121 are arranged at the median line at regular intervals. Air is allowed to flow from bottom to top through the holes 121 without interrupting evacuation of the process chamber 59.

Figure 6:
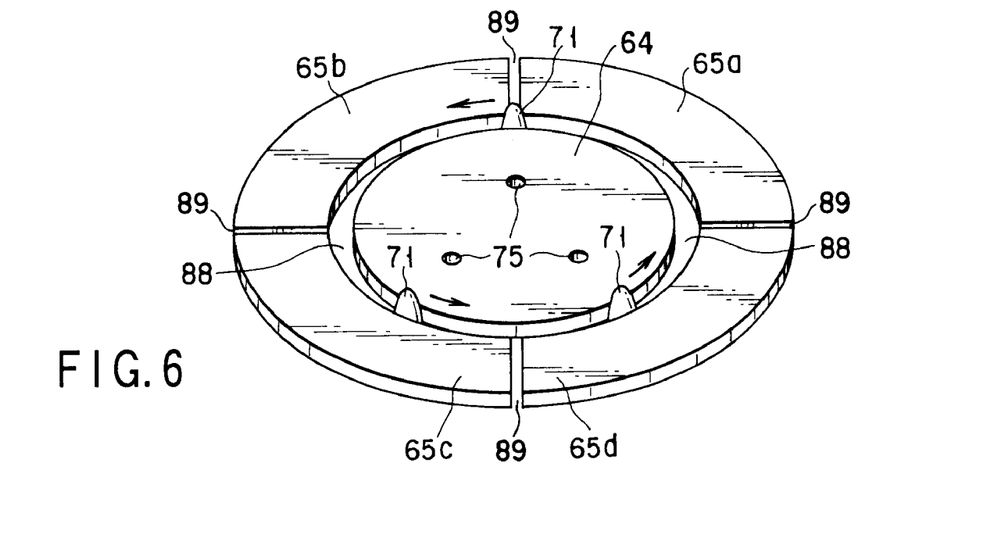
FIG. 6 is a perspective view showing the relationship between the hot plate assembly and a support pin.

The annular clearance 88 of about 1–7 mm diameter is formed between the central hot plate 64 and the outer region 65 of the hot plate assembly 63. Three support pins 71 are arranged within the annular clearance 88 for supporting the wafer W during the heating process, as shown in FIG. 6. The tips of the support pins 71 slightly protrude from the hot plate assembly 63, as shown in FIG. 4, thereby supporting a wafer W without being in contact with the hot plate assembly.

The support pins 71 are vertically set on a circular flange 72 which is placed below the hot plate assembly 63. Therefore, the whole load of the wafer W supported by the support pins 71 is applied to the flange 72. A rotation-driving section 73 is provided below the flange 72. When the rotation-driving section 73 rotates the flange 72, the support pins 71 rotate within the annular clearance 88, thereby rotating the wafer W placed on the supporting pins.

As shown in FIG. 4, three holes 75 are formed through the central hot plate 64 of the hot plate assembly 63 and a liftable pin 76 is movably provided through each of the holes 75. These liftable pins 76 support and move a wafer W up and down when the wafer W is transferred on the hot plate assembly 63.

The hot plate housing section 61 has a circular support ring 77 for supporting the outer region 65 of the hot plate assembly 63 and a support table 78 for supporting the support ring 77.

The support ring 77 is provided with an insulating material to trap the heat within the hot plate assembly 63. The support table 78 is formed nearly cylindrically with an upper surface opened and supports the support ring 77 placed thereupon. Note that the central hot plate 64 is also supported by columns (not shown).

The hot plate housing section 61 has a nearly cylindrical support ring 79 surrounding the support ring 77 and the support table 78. The support ring 79 has gas-outlet ports 79a for supplying an inert gas into the process chamber 59. Furthermore, a case 80 of nearly cylindrical form is provided around the support ring 79 and serves as the outer cover of the hot plate housing section 61. In the center bottom of the case 80, a hole 80a is formed for the flange 72. To describe more specifically, the flange 72 is formed so as to block the opening of the hole 80a.

Now, the PEB unit 44 configured as mentioned above will be explained together with a photolithographic process performed in the coating and developing system 1.

First, the sub arm mechanism 7 takes out a single wafer W unprocessed from the cassette C and transfers it to the extension unit 32 belonging to the third process unit group G3. Subsequently, the main arm mechanism 13 transfers the wafer W to the adhesion unit 31, where the adhesion of a resist solution to the wafer W is improved by applying an adhesion reinforcing agent such as HMDS. Subsequently, the wafer W is transferred to the cooling unit 30 and cooled to a predetermined temperature and then transferred to the resist coating unit 17 or 19 to form a resist film. The wafer W having a resist film formed thereon is sequentially transferred to a prebaking unit 33 or 34 and the extension cooling unit 41, where predetermined treatments are performed respectively.

Next, the second arm mechanism 50 takes out the wafer W from the extension cooling unit 41 and transfers it to the peripheral light exposure unit 51 and then a light exposure apparatus (not shown). The second sub arm mechanism 50 transfers the wafer W exposed to light to the extension unit 42, and thereafter, the main arm mechanism 13 transfers it to the PEB unit 44 or 45.

In the PEB unit 44 or 45, the wafer W is heated to a high temperature as described later. Thereafter, the main arm mechanism 13 transfers the wafer W to the cooling unit 43, the developing unit 18 or 20, post baking unit 35 or 36, and the cooling unit 30, in this order. A predetermined treatment is performed in each unit. The wafer is then transferred to the extension unit 32 and returned to the cassette C by the sub arm mechanism 7. In this manner, a series of processes of photolithography is completed.

Next, the function of the PEB unit 44 will be explained more specifically. In the PEB unit 44, the temperature of the hot plate assembly 63 is set and maintained at a predetermined value. For example, when the temperature of the hot plate assembly 63 is set at, for example, 500° C. by the controller 69, the heaters 67a to 67e heat the central hot plate 64 and each of segment hot plates 65a to 65d to 500° C. An infrared emission thermo-sensor 70 (thermometer) monitors the temperatures of these hot plates 64, 65a–65d. Based on the data thus monitored, the temperatures of the hot plates 64 and 65a–65d are more specifically adjusted. In this manner, the whole temperature of the hot plate assembly 63 is maintained at a predetermined temperature.

When the main arm mechanism 13 transfers a wafer W into the PEB unit 44 and places it the liftable pins 76 which have been allowed to move up and placed at a standby position, the heating of the wafer W is started.

Subsequently, the cover is moved down and combined with the hot plate housing unit 61 to form the process chamber 59. At the same time, supply of an inert gas is initiated from the gas-outlet port 79a of the support ring 79. The inert gas passes through the process chamber 59 and goes out from the exhaust portion 62. The atmosphere of the process chamber 59 is maintained at predetermine conditions by the inert gas flow.

Thereafter, when the liftable pins 76 mounting the wafer W thereon are moved down, the wafer W is brought down and placed on the support pins 71. The wafer W is thus placed above the hot plate assembly 63 without being in contact with the assembly. Upon placing the wafer W on the support pins 71, the heating of the wafer W is started to 500° C. The surface of the wafer W is heated uniformly by the hot plate assembly 63 consisting of the central hot plate 64 and segment hot plates 65a to 65d, all being adjusted at the same temperature.

The rotation-driving section 73 then rotates the support pins 71 along the slit D to rotate the wafer W, thereby equalizing the heat quantity given by segment hot plates 65a–65d to the outer region of the wafer W. As a result, thermal hysteresis of the outer region of the wafer W becomes constant. After the rotation is continued for a predetermined time, the rotation of the support pins 71 is terminated to stop the wafer W.

Thereafter, the liftable pins 76 are again moved up and accordingly the wafer W moves up, thereby separating the wafer W from the hot plate assembly 63 to terminate the heating of the wafer W. After completion of the heating of the wafer W, the cover 60 is moved up to open the process chamber 59. The wafer W is transferred from the liftable pins 76 to the main arm mechanism 13, which unloads the wafer W from the PEB unit 44. In this manner, a series of heating processes is terminated.

According to the embodiment mentioned above, since the hot plate assembly 63 is divided into the central hot plate 64 and the segment hot plates 65a–65d of the outer region 65, the degree of the heat distortion of the hot plate assembly 63 itself can be reduced to render the assembly flat. As a result, the wafer W is heated uniformly. Therefore, distortion and warpage of the wafer W, which occur when the wafer W is heated nonuniformly, can be suppressed. Furthermore, in accordance with the reduction of the heat distortion of the hot plate assembly 63, the strength of the hot plate assembly 63 can be reduced proportionally. As a result, the thickness of the hot plate assembly 63 can be reduced. By virtue of this, the heat response (quickly heating and cooling) of the hot plate assembly 63 can be improved, thereby heating the wafer W to a predetermined temperature, more accurately. In addition, if the hot plate assembly 63 is partly damaged, only the replacement of a damaged portion is required. Therefore, the maintenance cost for the PEB unit 44 and the like can be reduced.

Since the outer region 65 is divided into four segment hot plates 65a–65d, the degree of the distortion of the outer region 65, which is relatively easily distorted by heat, can be further reduced. A wafer is heated by a conventional hot plate of undivided form, the wafer W is distorted like a so-called saddleback(, that is, divided into four regions). When the present inventors performed an experiment for heating a wafer by a hot plate whose outer region 65 is divided into 4 arch-form regions, as is in the embodiment of the present invention, they have confirmed that the degree of the saddleback distortion was successfully reduced.

The temperature control unit 66 provided herein controls individual temperatures of the central hot plate 64 and the segment hot plates 65a to 65d of the hot plate assembly 63, thereby controlling the temperature of the hot plate assembly 63 within a narrow range. As a result, the wafer W can be heated by the hot plate assembly 63 heated more uniformity in temperature. In addition, even if the temperature of the hot plate assembly 63 is locally changed for any reason, the temperature of the local portion can be controlled in a position-specific manner.

In this embodiment, the temperature of the hot plate assembly 63 is detected by a non-contact thermo sensor 70. Therefore, the hot plate assembly 63 can be formed thinner. Even if a thermo sensor cannot be attached directly to the hot plate assembly 63, it is favorable that the temperature of the hot plate can be detected. In addition, in the case where the thermo sensor 70 is attached directly to the hot plate, if the hot plate assembly 63 is broken, the thermo sensor has to be replaced. However, in the case of the present invention, it is now necessary to replace the temperature sensor 70. Therefore, the manufacturing cost reduces. Note that the thermo-sensor 70 may be a non-contact thermo sensor, such as a thermocouple, which is detachably attached to the hot plate assembly 63.

The support pins 71 are attached to annular clearance 88. A wafer W is heated while being supported by the support pins. Since the load of the wafer W is not applied to the hot plate assembly 63, it is not distorted by the load. Furthermore, in accordance with the reduction of the heat distortion of hot plate assembly 63, the thickness of the hot plate assembly 63 can be reduced proportionally, thereby improving the heat response (quickly heating and cooling) thereof.

The rotation driving section 73 is provided to the support pins 71 to rotate the wafer W. Therefore, the wafer W can be heated while rotating it, enabling the uniform heating of the outer region of the wafer W. Indeed, the heat provided from the segment hot plates 65a–65d of the hot plate assembly 63 is disturbed by external causes and slightly changes. To equalize the heat quantities provided from the segment hot plates 65a–65d by rotating the wafer W.

In the aforementioned embodiment, the temperatures of individual portions of the hot plate assembly 63 consisting of the central hot plate 64 and the segment hot plate 65a–65d are set at the same temperature. Alternatively, the temperatures of individual sections of the hot plate assembly may be independently set based on the data which has been previously obtained with respect to the temperatures of the individual portions when the wafer W can be uniformly heated while distortion is suppressed. In this manner, the in-plane temperature of the hot plate can be specifically controlled in consideration of the distortion characteristics of the wafer W. As a result, the wafer W can be more uniformly heated and thus the distortion of the wafer W can be suppressed.

As mentioned in the embodiment, to control the in-plane temperature of the hot plate uniformly, the heaters 67a–67d (the heaters of the outer region 65) are connected and integrated into one body. Alternatively, the integrated circular heater may be used together with the heaters discretely provided at the segment hot plates 65a–65d.

Figure 7:
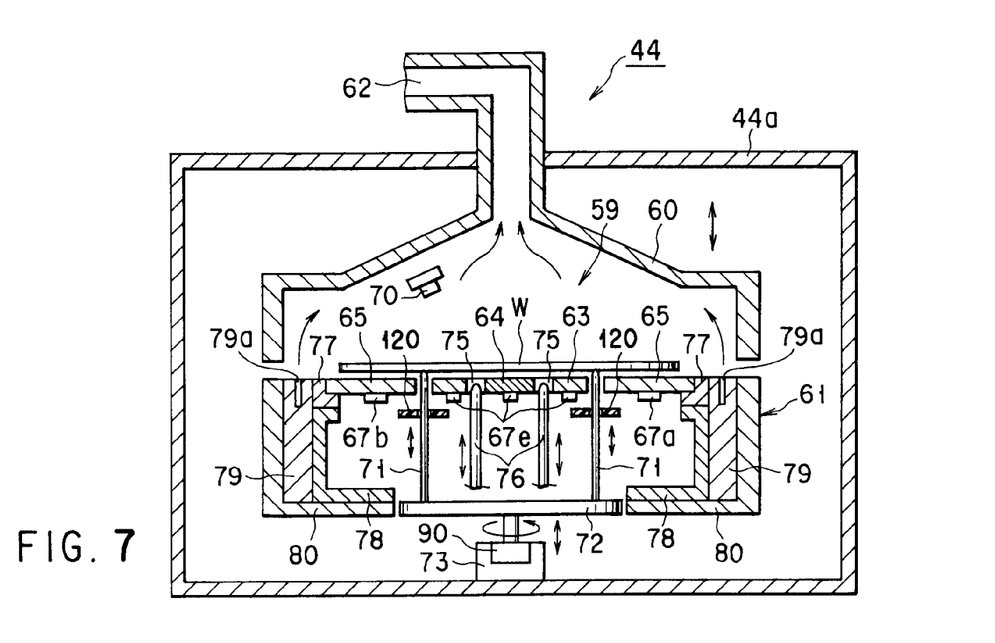
FIG. 7 is a perspective view of a PEB apparatus (a support pin up-and-down moving mechanism) according to another embodiment.

In the aforementioned embodiment, only the support pins 71 can be rotated. However, the support pins 71 may move up and down to arbitrary positions. FIG. 7 shows an example of this embodiment. An up-and-down movement driving section 90 having a cylinder or the like is provided below a flange 72, which supports the support pins 71. When the wafer W is baked, first the support pins 71 is previously placed at a position away from the hot plate assembly 63 at a predetermined distance, at which the wafer W on the support pins 71 can be heated but the reaction of a chemical solution applied on the wafer W cannot be initiated. Then, the wafer W is moved down by the liftable pins 76 and transferred to the support pins 71. The wafer W is heated to a relatively low temperature by radiant heat from the hot plate assembly 63. Thereafter, the support pins 71 are moved down near the hot plate assembly 63 and then heated to a predetermined temperature. As described above, the support pins 71 are designed movable. In addition, the wafer W is preheated and then subjected to normal heating process. Therefore, the temperature of the wafer W can be suppressed from being sharply increased. Hence, the heat distortion of the wafer W can be reduced.

The up-and-down movement driving section may be fitted to each of the support pins 71 to move the support pins independently, thereby tilting the wafer W. When the wafer W is baked while being tilted and returned flat, it is baked in accordance with the distortion characteristics thereof.

Figure 8:
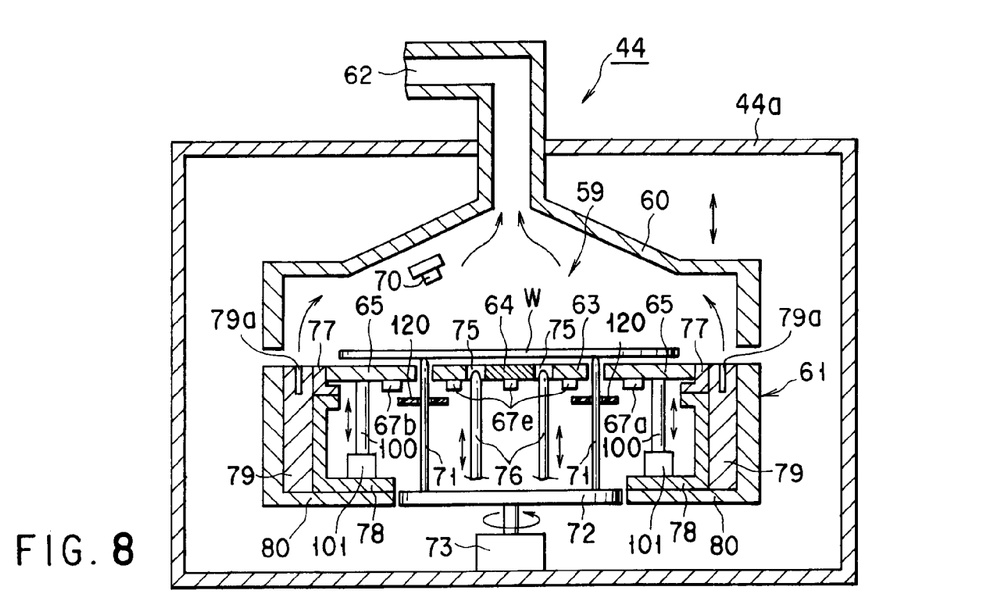
FIG. 8 is a perspective view of a PEB apparatus (a segment hot plate up-and-down moving mechanism) according to another embodiment.

The segment hot plates 65a–65d of the hot plate assembly 63 described in the aforementioned embodiment may be designed to move up and down. In this case, as shown in FIG. 8, columns 100 are provided below the hot plate assembly 63 for supporting the individual segment hot plates 65a–65d, and a driving section 101 having a cylinder is arranged at the lower portion of each of the columns 100 for moving up and down the column 100. The positions of the segment hot plates 65a–65d which heat the wafer W uniformly, thereby suppressing the distortion of the wafer W are experimentally obtained in advance. When or before the heating process is initiated, the segment hot plates 65a–65d are moved by the driving section 101 to the positions thus determined. In this manner, the wafer can be heated uniformly, thereby suppressing the distortion of the wafer W. Alternatively, the segment hot plates 65a–65d may be set inclined in parallel to the distortion curve of the wafer W experimentally obtained. In addition, the central hot plate 64 of the hot plate assembly 63 may be designed to move up and down.

The positions of the movable segment hot plates 65a–65d may be changed based on the in-plane temperature of a wafer W. More specifically, the in-plane temperature of the wafer W is detected by a thermo sensor. If there is a region of the wafer W whose temperature is lower than a target temperature, the segment piece of the hot plate assembly 63 facing to the region of the wafer W is moved up to approach the wafer. Alternatively, the segment piece of the hot plate assembly 63 facing to the region whose temperature is higher than the target temperature is moved down to keep a distance from the wafer W. As mentioned above, by individually controlling the heights of the segment hot plates 65a–65d, the wafer W can be uniformly heated, thereby suppressing the distortion of the wafer W. Note that the non-contact thermo sensor 70 is used to detect the in-plane temperature of the wafer W.

Figures 9, 10:
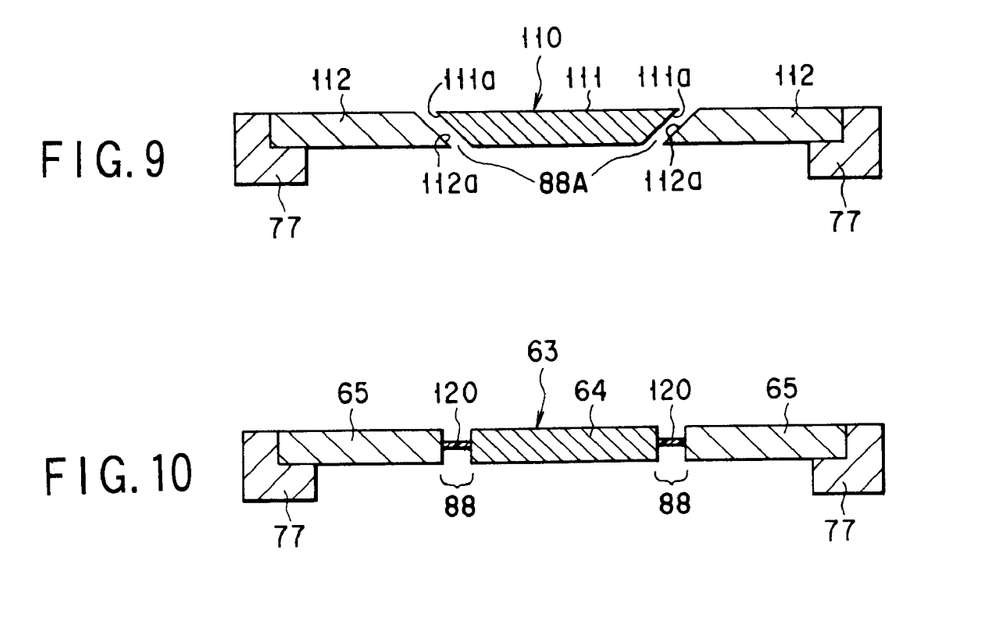
FIG. 9 is a longitudinal sectional view of a hot plate assembly according to another embodiment.
FIG. 10 is a longitudinal sectional view of a hot plate assembly having a seal film (polyimide film) according to another embodiment.

FIG. 9 shows a hot plate of another embodiment. In the hot plate assembly according to the aforementioned embodiments, the annular clearance 88 formed between the central hot plate 64 and each of the segment hot plates 65 is a see-through slit as viewed from the top. Whereas in the hot plate assembly 110 of this embodiment, an annular clearance 88A formed between a central hot plate 111 and each segment hot plate 112 is not a see-though slit as viewed from the top.

To be more specific, the outer peripheral edge surface 111a of the central hot plate 111 and the inner peripheral edge surface 112a of the segment hot plate 112 are formed obliquely. The outer peripheral edge surface 111a and the inner peripheral surface 112a are substantially in parallel. Between both edge surfaces 111a and 112a, the annular clearance 88A is formed obliquely.

In this case, the angle of inclination θ of each of the edge surfaces 111a and 112a preferably falls within the range of 30 to 60°. Since the outer peripheral edge surface 111a is obliquely formed, the diameter of the upper surface of the central hot plate 111 is smaller than that of the lower surface thereof. The segment hot plate 112 is supported by a support ring 77.

In the case of the oblique annular clearance 88A, the outer peripheral edge surface 111a of the central hot plate and the inner peripheral edge surface 112a of the segment hot plate are overlapped with each other, as viewed from the top. Therefore, it is impossible to see downward from the top through the clearance. Thermal energy is emitted from the outer periphery surface 111a as well as the inner periphery surface 112a in the same manner as the heat-emission surface. However, since the lower surface of the wafer W cannot be seen through the oblique annular clearance 88A, it is possible to prevent the wafer W from being heated nonuniformly (it is possible to heat the wafer W uniformly).

Figure 12:
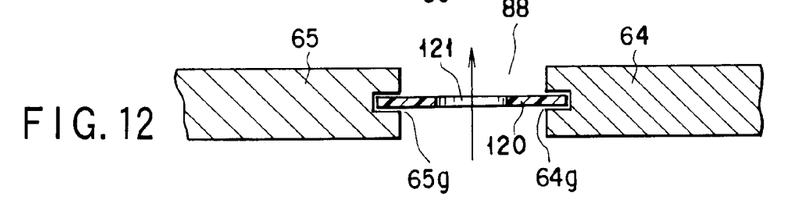
FIG. 12 is an enlarged sectional view of the seal film.

As shown in FIGS. 10, 11, and 12, to prevent air from freely passing through the annular clearance 88, a shield member 120 may be provided to the annular clearance 88. As the shield member 120, a polyimide resin film having excellent insulating characteristics may be used. As shown in FIG. 12, numerous pores 121 are formed in the median line of the polyimide resin film 120 to allow air to pass through to some extent.

As shown in FIG. 12, one of the longitudinal edges of the polyimide resin film 120 is inserted into a slit 64g of the central hot plate 64, whereas the other longitudinal (lengthwise) edge is inserted into a slit 65g of the segment hot plate 65. The both longitudinal edges may be adhered with an adhesive agent to the hot plates 64, 65, respectively.

As described in the above, the polyimide film 120 provided in the annular clearance 88 can prevent airflow from passing through the annular clearance 88. Because of the presence of the polyimide film 120, the temperature of a wafer W is prevented from partially decreasing by the airflow. The wafer W is therefore heated more uniformly. As the shielding material, any material such as a magnetic fluid and an elastic material may be used.

In the aforementioned embodiments, the hot plate assembly 63 is divided into the central hot plate 64 and four segment hot plates 65. However, the number of the segment hot plates 65 may be 2, 3, 5, 6, 7, and 8 other than 4.

Figure 13:
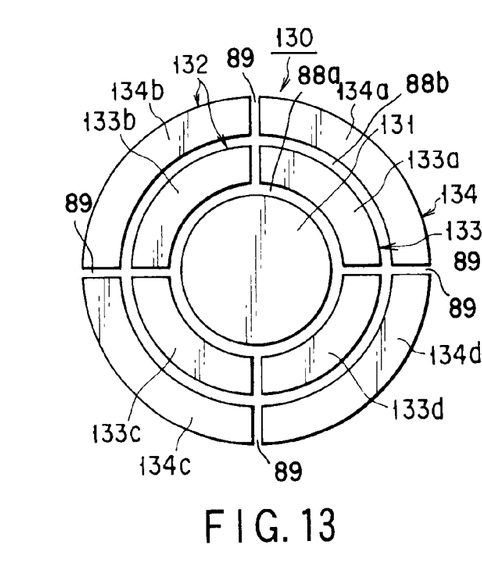
FIG. 13 is a schematic plan view showing a hot plate assembly according to another embodiment.

More specifically, as shown in FIG. 13, the hot plate assembly 130 may be divided into a central region 131 and an outer region 132. The outer region 132 may be divided into an inner circular region 133 and an outer circular region 134, both being concentrically arranged. The inner circular region 133 is further divided into four fan-shaped segment hot plates 133a–133d, whereas the outer circular region 134 is divided into four fan-shaped segment hot plates 134a–134d.

By dividing the outer region 132 of the hot plate assembly 132 into numerous sections, the heat distortion of the entire hot plate can be decreased and the flatness is thus improved. Consequently, the wafer W is uniformly heated, preventing the distortion of the wafer W.

Figure 14:
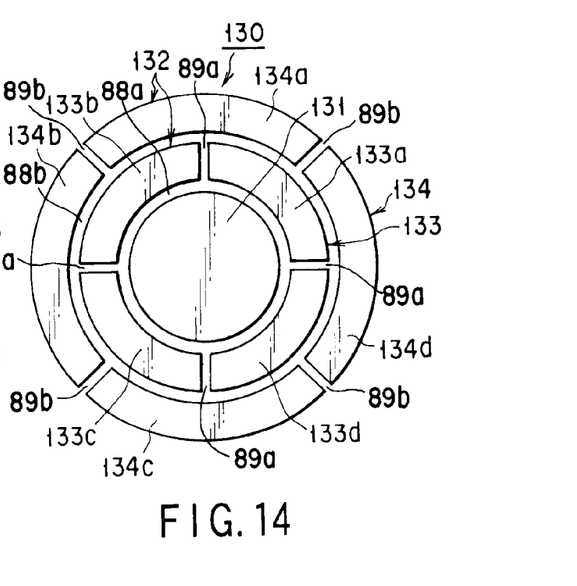
FIG. 14 is a schematic plan view showing a hot plate assembly according to another embodiment.

As shown in FIG. 14, the radial clearances 89b between the segment hot plates 134a–134d of the outer region 134 may not be aligned with those 89a between the segment hot plates 133a–133d of the inner region 133. In short, both clearances 89a and 89b may be formed discontinuously.

Because of this structure, even if local temperatures of the wafer W differ due to the radial clearances 89a and 89b, such a difference is cancelled out. As a result, the temperature of the wafer W after heating becomes uniform. Incidentally, the concentric outer regions of the hot plate assembly may not be always divided into two and may be divided into three or four.

In the aforementioned embodiments, the present invention is applied to the PEB unit 44. However, the present invention may be applied to other heating process unit, such as the prebake units 33, 34 and the post bake units 35, 46.

Furthermore, in the aforementioned embodiments, the present invention is applied to a heating apparatus of a wafer used in a photolithographic step of a semiconductor device manufacturing process. The present invention can be applied to a heating device for a substrate other than a semiconductor wafer, such as an LCD substrate.

According to the present invention, it is possible to ensure the flatness of the entire hot plate and suppress the heat distortion of a substrate (wafer) by assembling hot plate pieces having similar heat-generation characteristics. In this way, the yield of the heating process is improved.

When a wafer of 8-inch diameter is heated to 700° C. by a conventional single hot plate, there is about 10% region whose in-plane temperature differs from each other (non-uniformity in plane temperature). In contrast, when a wafer of 8-inch diameter is heated to 700° C. by the assembly hot plate of the present invention, there is about 2% region or less whose in-plane temperature differs from each other. As a result, the heat distortion of a substrate during the heating process can be greatly reduced.

What is claimed is:

1. A heating treatment apparatus for heating a substrate to be processed by photolithography comprising:
    a central hot plate having a heat-generating surface which faces a center portion of a lower surface of the substrate and heating the center portion of the substrate;
    a plurality of segment hot plates provided so as to surround a periphery of the central hot plate in a plan view, having a heat-generating surface facing a peripheral portion of the lower surface of the substrate and heating a periphery of the substrate;
    a hot plate support member supporting the central hot plate and the segment hot plates;
    a substrate support member supporting the substrate so as to face the central hot plate and the segment hot plates in a close proximity without being in contact with the central hot plate and the segment hot plates;
    a power supply for supplying electricity to the central hot plate and each of the segment hot plates;
    an up-and-down moving mechanism for moving the hot plate support member up and down together with the segment hot plates.

2. An apparatus according to claim 1, wherein said central hot plate has circular form in a plan view, and said segment hot plates are formed by dividing a ring-form peripheral portion surrounding the central hot plate into four, each having a fan shape in the plan view.

3. An apparatus according to claim 1, further comprising a temperature control unit for controlling an amount of heat generated from each of the segment hot plates by controlling an amount of electricity to be supplied from a power supply to each of the segment hot plates.

4. An apparatus according to claim 1, further comprising a thermo sensor provided to each of the segment hot plate and the substrate without being in contact therewith, and detecting at least one of temperatures of the lower and upper surfaces with respect to the substrate.

5. An apparatus according to claim 4, wherein a radial clearance is formed between adjacent segment hot plates and said thermo sensor is arranged immediately below the radial clearance for detecting temperature of the lower surface of the substrate.

6. An apparatus according to claim 4, wherein said thermo sensor is arranged above the central hot plate and the segment hot plates for detecting the temperature of the upper surface of the substrate.

7. An apparatus according to claim 1, wherein said substrate support member is independently and discretely formed from said hot plate support member such that the load of the substrate is not applied to the central hot plate and the segment hot plates.

8. An apparatus according to claim 1, wherein said segment hot plates comprise a plurality of inner segment hot plates concentrically arranged around the central hot plate and a plurality of outer segment hot plates concentrically arranged around the inner segment hot plates.

9. An apparatus according to claim 8, wherein
    a first radial clearance is formed between adjacent inner segment hot plates;
    a second radial clearance is formed between adjacent outer segment hot plates, said second radial clearance being formed away from the first radial clearance so as not to position on an extension line of the first radial clearance.

10. An apparatus according to claim 9, further comprising a thermo sensor arranged immediately below at least one of the first and second radial clearances, without being in contact with the segment hot plates, for detecting the temperature of the lower surface of the substrate.

11. A method of heating a substrate to be processed by photolithography, comprising:

(a) preparing a central hot plate having a heat generating surface which faces a center portion of a lower surface of the substrate and a plurality of segment hot plates each having a heat generating surface which faces a peripheral portion of the lower surface of the substrate;

(b) arranging said plurality of segment hot plates around said central hot plate;

forming an annular clearance between said segment hot plates and said central hot plate, inserting a plurality of support pins into the annular clearance from the bottom and allowing said support pins to protrude upward, supporting the substrate by the support pins without being in contact with the segment hot plates and the central hot plate, and moving the segment hot plates up and down to control a distance between the segment hot plates and the substrate; and (c) heating the center portion of the lower surface by the central hot plate, heating the peripheral portion of the substrate by said plurality of segment hot plates, thereby heating the entire substrate to a predetermined target temperature.

12. A method according to claim 11, wherein, said step (c), the heat amount generated from each of the segment hot plates is controlled by controlling the amount of electricity to be supplied to each of the segment hot plates.

13. A method according to claim 1, further comprising, in said step (a), a radial clearance is formed between adjacent segment hot plates, a thermo sensor is arranged immediately below the radial clearance, for detecting the temperature of the lower surface of the substrate through the radial clearance; and in said step (c), the amount of electricity supplied to each of said plurality of segment hot plates is controlled based on the temperature detected in the step (a), thereby controlling the heat amount generated from each of the segment hot plates.

14. A method according to claim 11, further comprising, in said step (c), the substrate is rotated together with the support pins.

15. A heating treatment apparatus for heating a substrate to be processed by photolithography, comprising:

a central hot plate having a heat-generating surface which faces a center portion of a lower surface of the substrate and heating the center portion of the substrate;

a plurality of segment hot plates which are provided so as to form an annular clearance between the central hot plate and the segment hot plates in a plan view, and each of which has a heat-generating surface facing a peripheral portion of the lower surface of the substrate for heating a periphery of the substrate;

a hot plate support member supporting the central hot plate and the segment hot plates;

a plurality of support pins arranged within the annular clearance for supporting the substrate so as to face the central hot plate and the segment hot plates to a close proximity without being in contact with the central hot plate and the segment hot plates;

a rotation driving mechanism for rotating the support pins along the annular clearance;

a power supply for supplying electricity to the central hot plate and the segment hot plates; and a shielding member arranged below the central hot plate and the segment hot plates for preventing cool air from passing through the annular clearance.

16. An apparatus according to claim 15, wherein said shielding member is a ring-form seal film attached to each of the support pins.

17. An apparatus according to claim 16, wherein said ring-form seal film has numerous small pores formed therein.

18. A heating treatment apparatus for heating a substrate to be processed by photolithography, comprising:

a central hot plate having a heat-generating surface which faces a center portion of a lower surface of the substrate and having an outer peripheral edge surface obliquely formed at a predetermined angle with respect to the heat-generating surface, for heating the center portion of the substrate;

a plurality of segment hot plates each having a heat generating surface facing a peripheral portion of the lower surface of the substrate, and having an inner peripheral edge surface obliquely formed at a predetermined angle with respect to the heat generating surface, for heating a peripheral portion of the substrate, said inner peripheral edge surface facing the outer peripheral edge surface of the central hot plate so as to form an annular clearance obliquely formed between the central hot plate and the segment hot plates, in a plan view;

a hot plate support member supporting the central hot plate and the segment hot plates;

a substrate support member for supporting the substrate so as to face the central hot plate and the segment hot plates in a close proximity without being in contact with the central hot plate and the segment hot plates; and a power supply for supplying electricity to the central hot plate and the segment hot plates, wherein the outer peripheral edge surface of the central hot plate and the inner peripheral edge surfaces of the segment hot plates are overlapped in the plan view, whereby the lower surface of the substrate cannot be seen through the annular clearance obliquely formed, from the side of the central hot plate and the segment hot plates.

* * * * *